US006746883B2

(12) United States Patent
Chung et al.

(10) Patent No.: US 6,746,883 B2
(45) Date of Patent: Jun. 8, 2004

(54) DIRECT DETERMINATION OF INTERFACE TRAPS IN MOS DEVICES

(75) Inventors: Steve S. Chung, Hsin-Chu (TW); Shang-Jr Chen, Ping-Tung Hsien (TW); Chien-Kuo Yang, Taipei Hsien (TW); Der-Yuan Wu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 43 days.

(21) Appl. No.: 10/064,036

(22) Filed: Jun. 4, 2002

(65) Prior Publication Data

US 2003/0224545 A1 Dec. 4, 2003

(51) Int. Cl.[7] ................................................ H01L 21/66
(52) U.S. Cl. ........................................................ 438/17
(58) Field of Search ............................ 438/14, 17, 18; 324/71.1, 71.5, 765

(56) References Cited

PUBLICATIONS

S.S. Chung et al., "A Novel and Direct Determination of the Interface Traps in Sub–100nm CMOS Devices with Direct Tunnelin Regime (12~16A) Gate Oxide," 2002 Symposium On VLSI Technology Digest of Technical Papers, pp. 74–75.*

Lewis M. Terman, Solid–State Electronic, vol. 5(5), 1962, p. 285–299.

P. Heremans et al., IEEE T–ed, vol. 36, 1989, p. 1318–1335.

S.S. Chung et al., Proc SSDM, 1993, p. 841–843.

C. Chen et al., IEEE T–ed, vol. 45, No. 2, 1999.

S.S. Chung et al., IEEE T–ed, vol. 46, 1999, p. 1371–1377.

P. Masson et al., IEEE Ed1, vol. 20, No. 2, 1999, p. 92–94.

* cited by examiner

*Primary Examiner*—Evan Pert
(74) *Attorney, Agent, or Firm*—Winston Hsu

(57) ABSTRACT

A low leakage charge pumping (CP) method has been implemented for direct determination of interface traps in ultra-short gate length MOS devices with ultra-thin gate oxide in the direct tunneling regime. The leakage current in a 12 Å–16 Å gate oxide can be removed from the measured CP current, which enables accurate determination of the interface traps. This method has been demonstrated successfully for variousRTNO grown and RPN treated oxide CMOS devices with very thin gate oxide. It can be used as a good monitor of ultra-thin gate oxide process and the evaluations of device reliabilities in relation to the interface trap generation. In addition, the current method can be used to determine the physical channel length of CMOS devices.

8 Claims, 12 Drawing Sheets

- Charge Pumping (CP) Setup

- $I_B = I_1 - I_2$
  = Recombination Current
  = CP Current ($I_{CP}$)

- $I_{GB}$ = Gate-Bulk Leakage

Replacement sheet

(1a) $L_{MASK} = L_{gate} + 2 * \frac{\Delta L_1}{2} = L_{gate} + \Delta L_1$ (1b) $L_{gate} = L_{eff} + 2 * \frac{\Delta L_2}{2} = L_{eff} + \Delta L_2$ (1c) $\Delta L_0 \cong \Delta L_1 + \Delta L_2$ (2a) $N_{it,1,total} = N_{it,11} + N_{it,12}$ (2b) $N_{it,2,total} = N_{it,21} + N_{it,22}$ (2c) $\Delta I_{CP,max} \propto \Delta N_{it,total} = N_{it,1,total} - N_{it,2,total}$
$= (N_{it,11} + N_{it,12}) - (N_{it,21} + N_{it,22})$
(if $N_{it,11} \approx N_{it,21}$)
$= N_{it,12} - N_{it,22} \propto \Delta L$ Table 1

DIRECT DETERMINATION OF INTERFACE TRAPS IN MOS DEVICES

BACKGROUND OF INVENTION

1. Field of the Invention

The present invention relates to semiconductor wafer testing. More particularly, this invention relates to characterization of semiconductor/oxide interface traps.

2. Description of the Prior Art

Recently, semiconductor devices have been integrated so highly that integrated semiconductor devices have been designed on a nanometer level instead of a micron level (e.g., The National Technology Roadmap for Semiconductors Technology Needs, SIA, 2001 edition). In accordance with the SIA roadmap, by 2002, scaling of a sub-100 nm device will need a gate oxide thickness ($t_{ox}$) in the range of about 12 to 15 angstroms. However, this raises a thorny problem of how to evaluate quality of an ultra-thin gate oxide layer with a thickness of 10 to 20 angstroms in terms of interface traps ($N_{it}$).

As known by those skilled in the art, two pronounced effects are observed during testing of a MOS device as a gate oxide thickness shrinks down to 30 Å and below, namely, Direct Tunneling Gate Leakage (DTGL) effect and the so-called quantum mechanical effect. These effects render the device characterization more difficult.

A conventional approach to determining the interface traps in a gate oxide interface of a CMOS device is a Capacitance-Voltage (CV) method, which is proposed by Lewis M. Terman in 1962 (Solid-State Electronics, Vol.5(5), p.285–299, Lewis M. Terman, 1962). Unfortunately, the prior art CV method is not able to extract accurate interface traps when the above-mentioned DTGL effect exists. Obviously, the prior art CV method is not an effective approach to the oxide quality evaluation of an ultra-thin gate oxide device. Plus, the prior art CV method requires a large area capacitor structure such that it can not be applied to the measurement of real small MOS devices (with short channel length and narrow width).

Another prior art approach is a so-called Charge-Pumping (CP) method, which is disclosed in articles such as IEEE T-ED, Vol.36, p.1318–1335, P. Heremans et al., 1989; Proc. SSDM, p.841–843, S. S. Chung et al., 1993; IEEE T-ED, Vol.45, No.2, p.512–519, C. Chen et al., 1999; IEEE T-ED, Vol.46, p.1371–1377, S. S. Chung et al., 1999; and IEEE EDL, Vol.20, No.2, p.92–94, P. Masson et al., 1999. However, none of the prior art CP approaches generate an accurate and satisfactory result, in particular when the thickness of a tested gate oxide is less than 12 angstroms and beyond. Consequently, there is a strong need to provide an accurate approach to the measurement of $N_{it}$ in the ultra-thin gate oxide age.

SUMMARY OF INVENTION

Accordingly, it is the primary objective of the claimed invention to provide an improved method for accurately characterizing semiconductor/oxide interface traps.

In accordance with the claimed invention, a method for determining interface traps in a semiconductor/oxide interface of a MOS transistor comprising a bulk substrate, a source, a drain, a gate, and a silicon oxide layer beneath the gate is provided. The method includes grounding the bulk substrate, source, and drain, applying a first gate pulse with a fixed low-level gate voltage ($V_{gl}$) and an increasing high-level gate voltage ($V_{gh}$) at a high gate pulse frequency on the gate so as to obtain a first charge-pumping current ($I_{CP}$)–$V_{gh}$ curve, applying a second gate pulse having same low-level gate voltage ($V_{gl}$) and same increasing high-level gate voltage ($V_{gh}$) as the first gate pulse at a lower gate pulse frequency on the gate so as to obtain a second $I_{CP}$–$V_{gh}$ curve, and subtracting the second $I_{CP}$–$V_{gh}$ curve from the first $I_{CP}$–$V_{gh}$ curve.

These and other objectives of the claimed invention will no doubt become obvious to those of ordinary skill in the art after reading the following detailed description of the preferred embodiment, which is illustrated in the various figures and drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1(a) schematically shows the fixed-based level pumping (GP) setup.

DETAILED DESCRIPTION

The present invention is directed to a method for accurately determining interface traps (hereinafter referred to as $N_{it}$) in a semiconductor/oxide interface of advanced metal-oxide-semiconductor (MOS) devices having a short channel length and an ultra-thin gate oxide thereof. The MOS devices to be tested are fabricated by state-of-the-art integrated circuit (IC) manufacturing techniques. For example, a high-quality ultra-thin gate oxide layer having a thickness of about 12 Å to 16 Å (direct tunneling regime) is formed on a cleaned surface of a semiconductor substrate by using a known Rapid Thermal Nitric Oxide (RTNO) process. In some cases, a Remote Plasma Nitridation (RFN) treatment is then used after the gate oxide formation for reducing the gate current leakage by a scale of about 2 to 3 orders. The masked lengths ranging from 0.22. m to 0.11. m are used.

By way of example, the RPN treatment is carried out in a suitable remote plasma tool that is commercially available from Applied Materials Corporation of Santa Clara, Calif. A wafer is placed in a second chamber located downstream from a first chamber so that species generated within the plasma pass over the wafer before being pumped out of the tool. In this manner, a gate oxide is not directly exposed to the plasma and therefore does not suffer plasma damage. Nitrogen is flowed into the plasma chamber at a flow rate of between about 600 and 3,000 sccm (Standard cubic centimeters per minute). Alternately $NH_3$ may be used, either instead of or in combination with nitrogen. The pumping rate of the tool is throttled to maintain a chamber pressure of between about 1 and 3 Torr in the second chamber. Plasma is struck in the first chamber and active nitrogen species from the remote plasma flow over the wafer surface and incorporate into the gate oxide, thereby nitriding an upper portion of the gate oxide. The RPN treatment is conducted with the wafer heated to a temperature between about 500° C. and 1,000° C. for a period of between about 3 and 5 minutes.

Figure 1A:
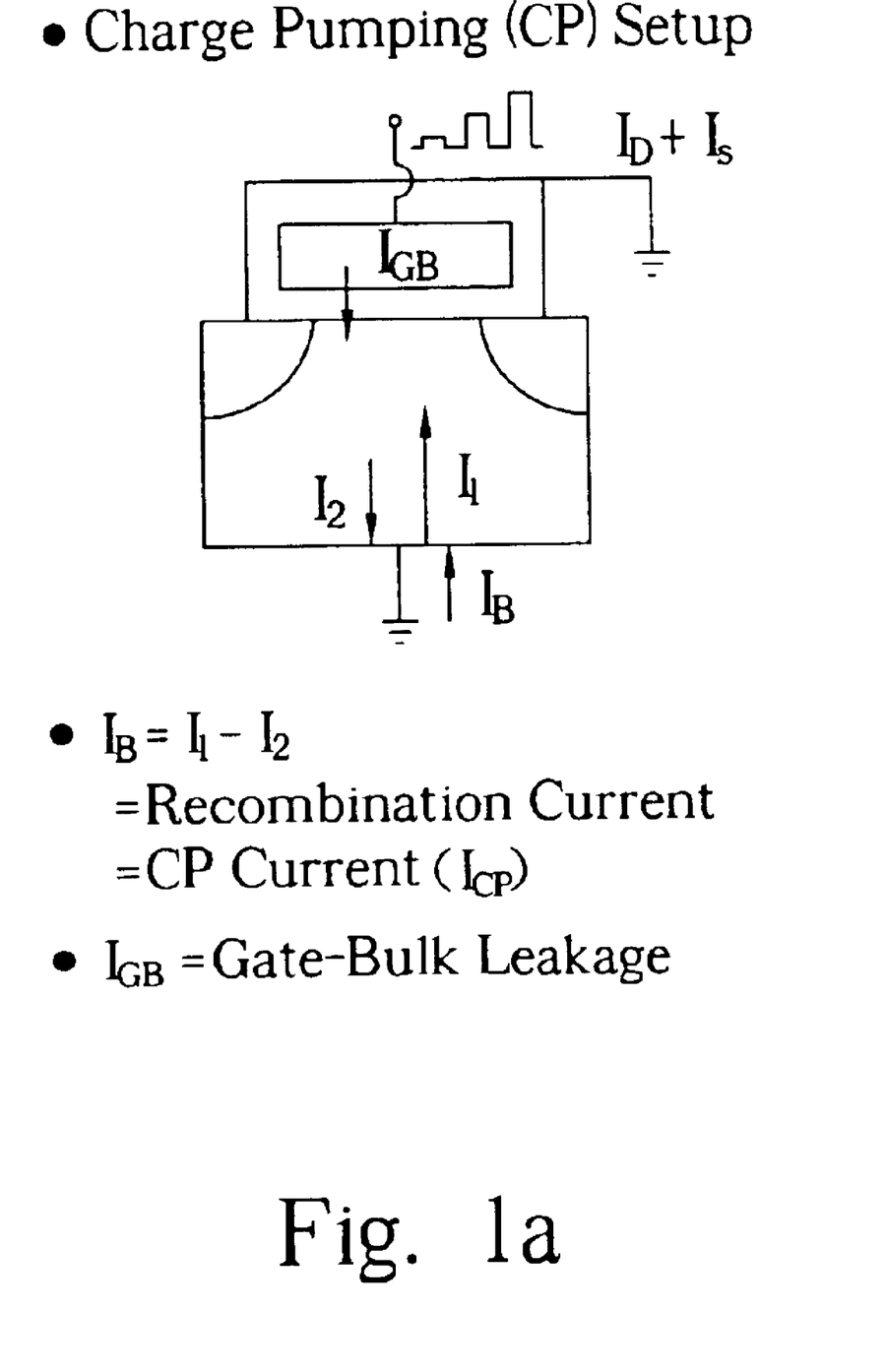

Please refer to FIG. 1(a). FIG. 1(a) is a schematic diagram of this invention. Here, with both source/drain (S/D) grounded and by applying a gate pulse with fixed base voltage ($V_{gl}$), the channel operates between accumulation and inversion states. This gives rise to the charge pumping current (hereinafter referred to as $I_{CP}$) measured from the bulk substrate.

Figure 2:
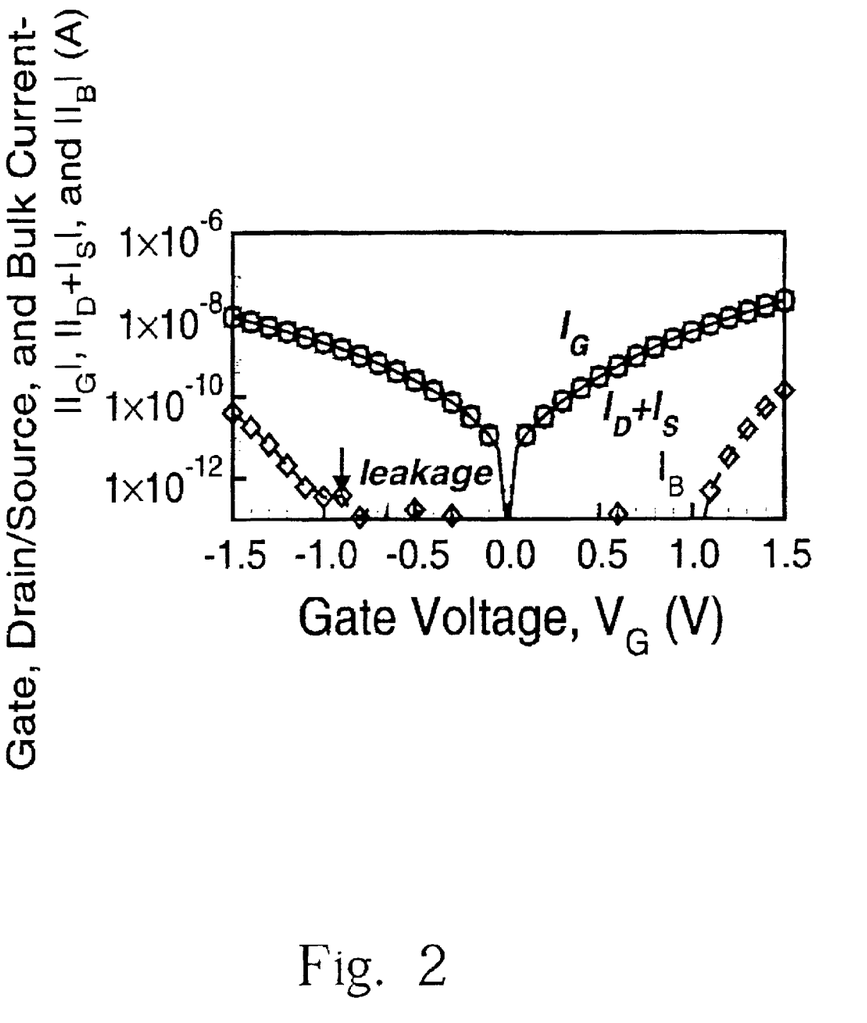
FIG. 2 shows current components for FIG. 1(a).
Figure 3:
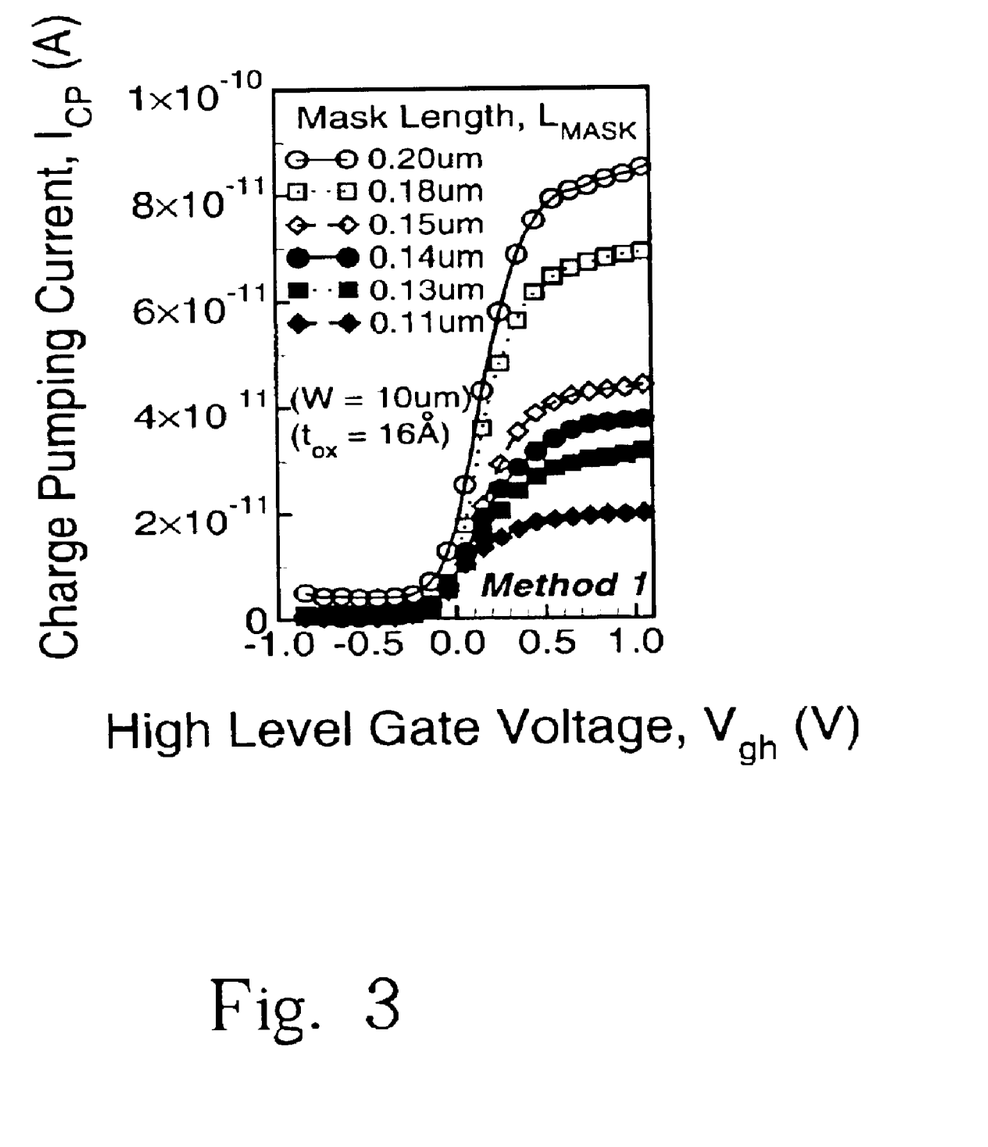
FIG. 3 shows CP curves for a 16 Å gate oxide device.

Please refer to FIG. 2 and FIG. 3. FIG. 2 shows experimental results of various current components of the measurement in FIG. 1(a) wherein the gate current ($I_G$) is approximately equal to the combination of the drain current ($I_D$) and source current ($I_S$). FIG. 3 shows experimental results of CP curves. As shown in FIG. 2 and FIG. 3, obviously, leakage current occurs at a low $V_{gh}$ in the accumulation region. Accordingly, in a preferred embodiment of this invention, the configuration as depicted in FIG. 1(a) is used for the CP measurement with a suitable chosen gate voltage.

Figure 1B:
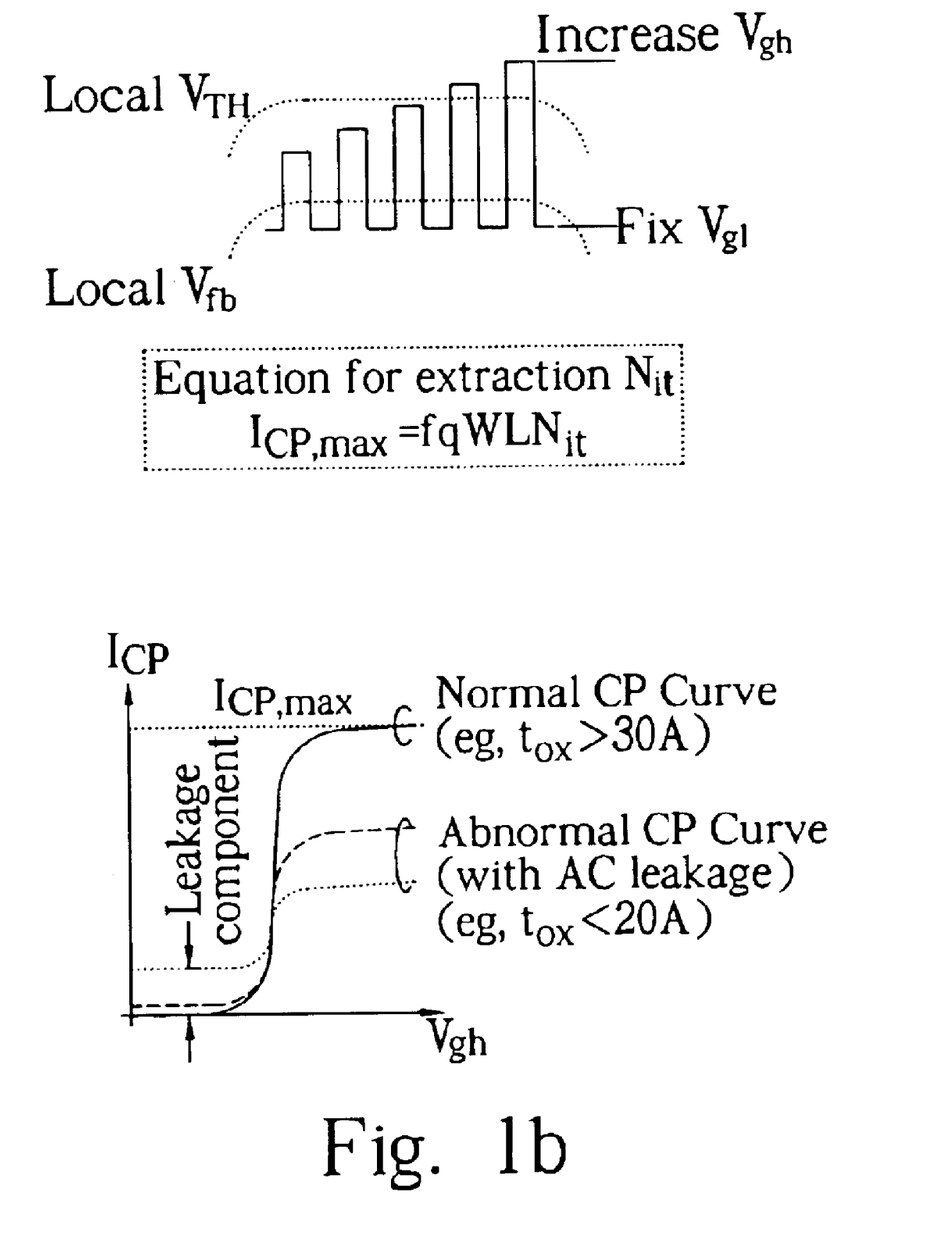
FIG. 1(b) schematically shows local threshold voltage ($V_{TH}$) and flat band ($V_{fb}$) distribution in relating to low level and high level gate voltage ($V_{gl}$ and $V_{gh}$), and normal and abnormal CP curves.

Please refer to FIG. 1(b). In the upper area of FIG. 1(b), local threshold voltage ($V_{TH}$) and flat band ($V_{fb}$) distribution in relation to a low-level gate voltage ($V_{gl}$) and a high-level gate voltage ($V_{gh}$) is schematically shown. In the lower area of FIG. 1(b), correlation of normal and abnormal CP curves is demonstrated. The basic extraction equation for extracting $N_{it}$ (eV$^{-1}$) is demonstrated as follows:

$$I_{CP, MAX} = f \times q \times W \times L \times N_{it}$$

where $I_{CP, MAX}$ is maximum $I_{CP}$ of a characteristic (Amp.); "f" is frequency of gate pulse (Hz); "q" is electron charge (C); "W" is transistor width ($\mu$m); "L" is channel length ($\mu$m). As seen in FIG. 1(b), the leakage component of $I_{CP}$ is very small at a low $V_{gh}$ when $t_{ox}$>30 Å. The leakage current becomes dominant when $t_{ox}$ is less than 20 Å. It is believed that the leakage component of the bulk current comprises tunneling current and PN junction current.

Figure 4:
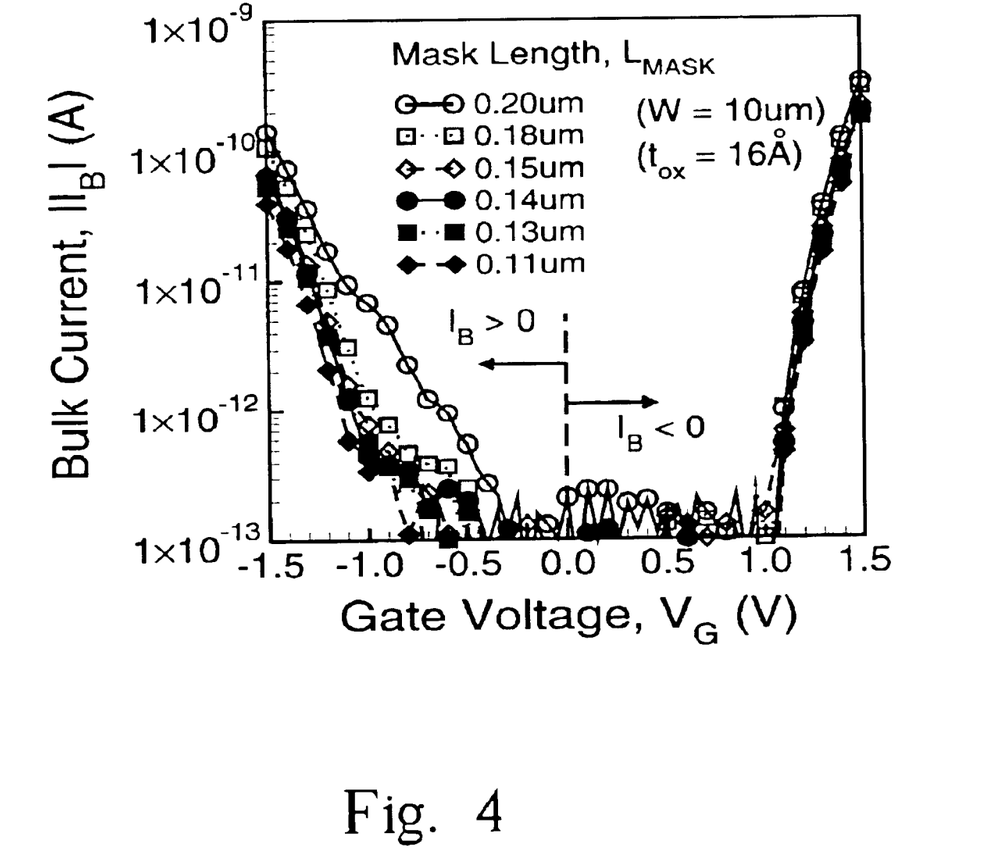
FIG. 4 shows length dependent bulk currents.
Figure 5:
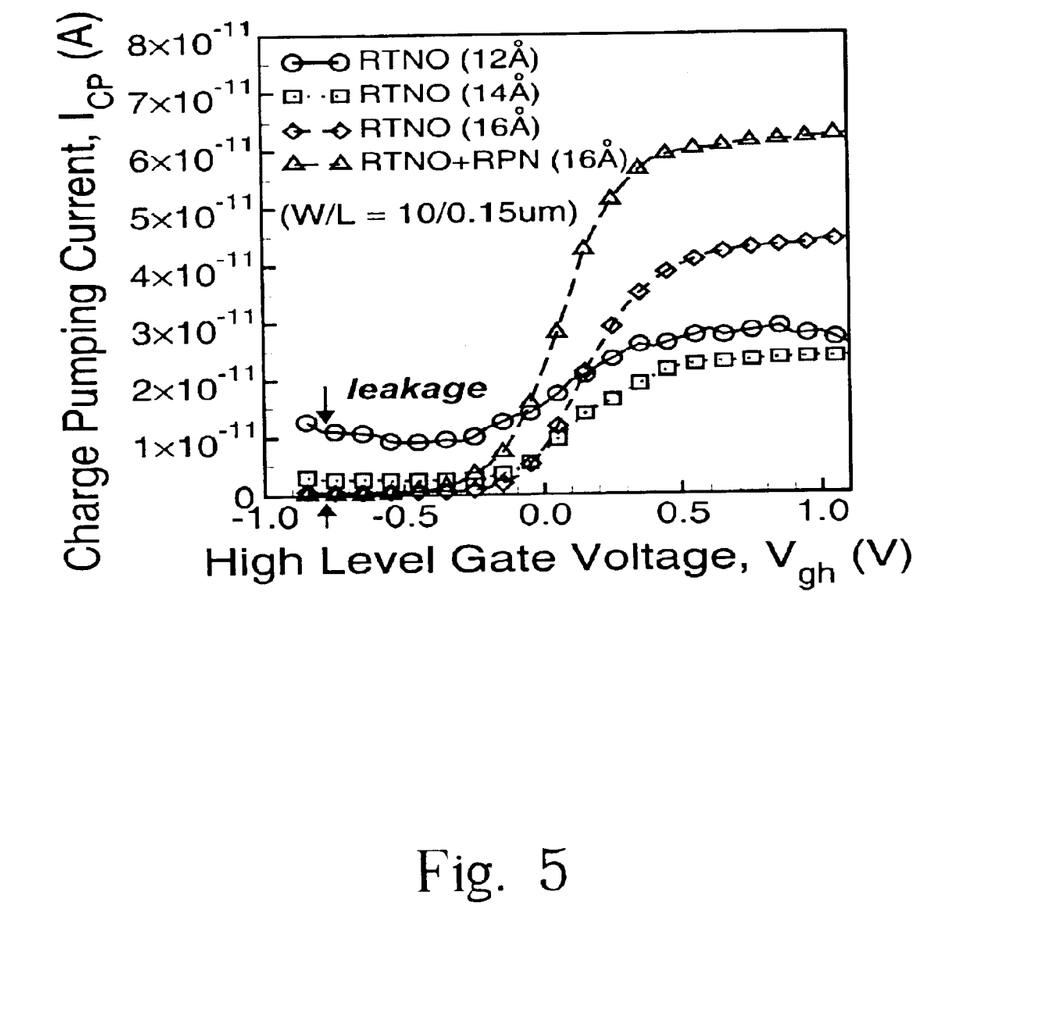
FIG. 5 shows measured CP currents for an ultra-thin (12~16 Å) gate oxide layer.

In FIGS. 4 and 5, experimental results in accordance with the present invention are demonstrated. As shown in FIG. 4 and FIG. 5, the bulk current ($I_B$) decreases with reducing channel length. This means that it is better to measure a low leakage $I_{CP}$ current with a shorter channel length device. The leakage current increases with reducing $t_{ox}$ (at $V_G$<0V). In FIG. 5, note that 12 Å gate oxide has large leakage currents for $V_{gh}$<0V. Before calculating $N_{it}$ from $I_{CP}$, we need to remove the leakage current from the $I_{CP}$.

Figure 1C:
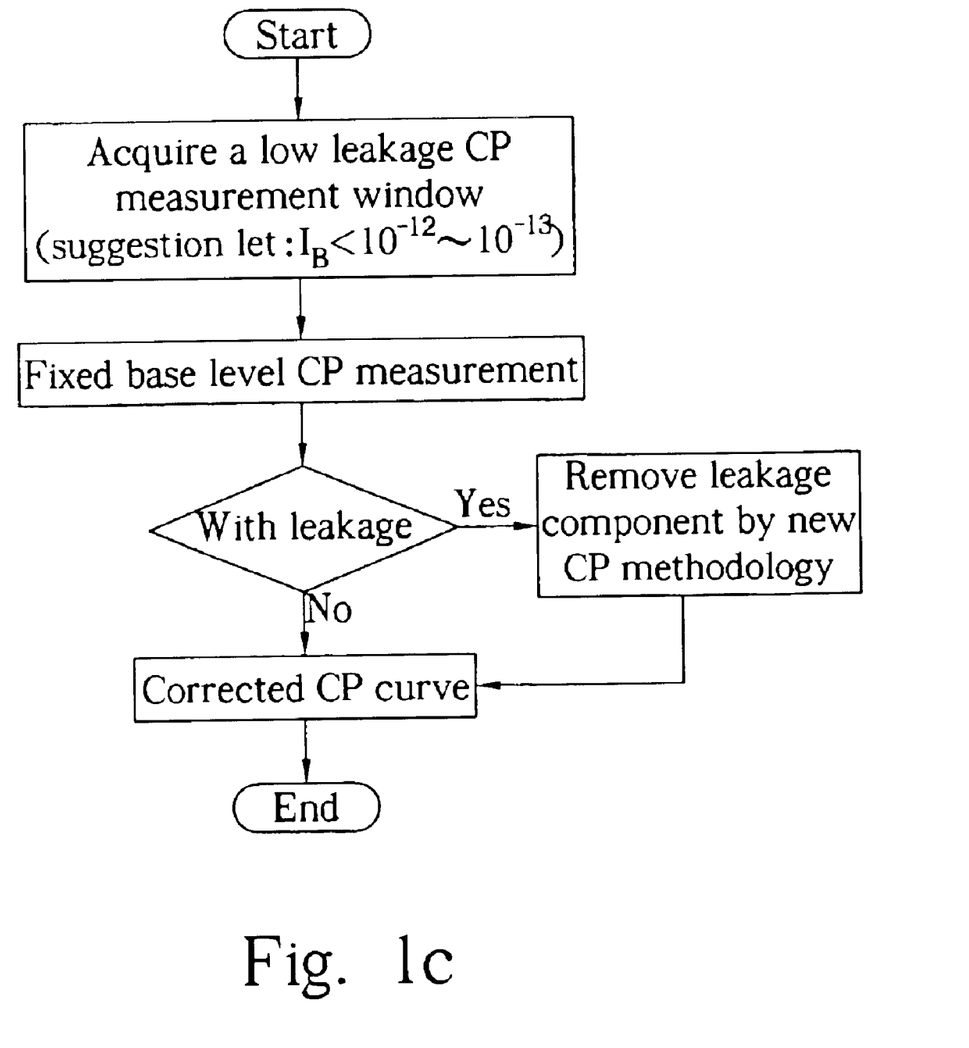
FIG. 1(c) is a flowchart according to this invention.
Figure 6:
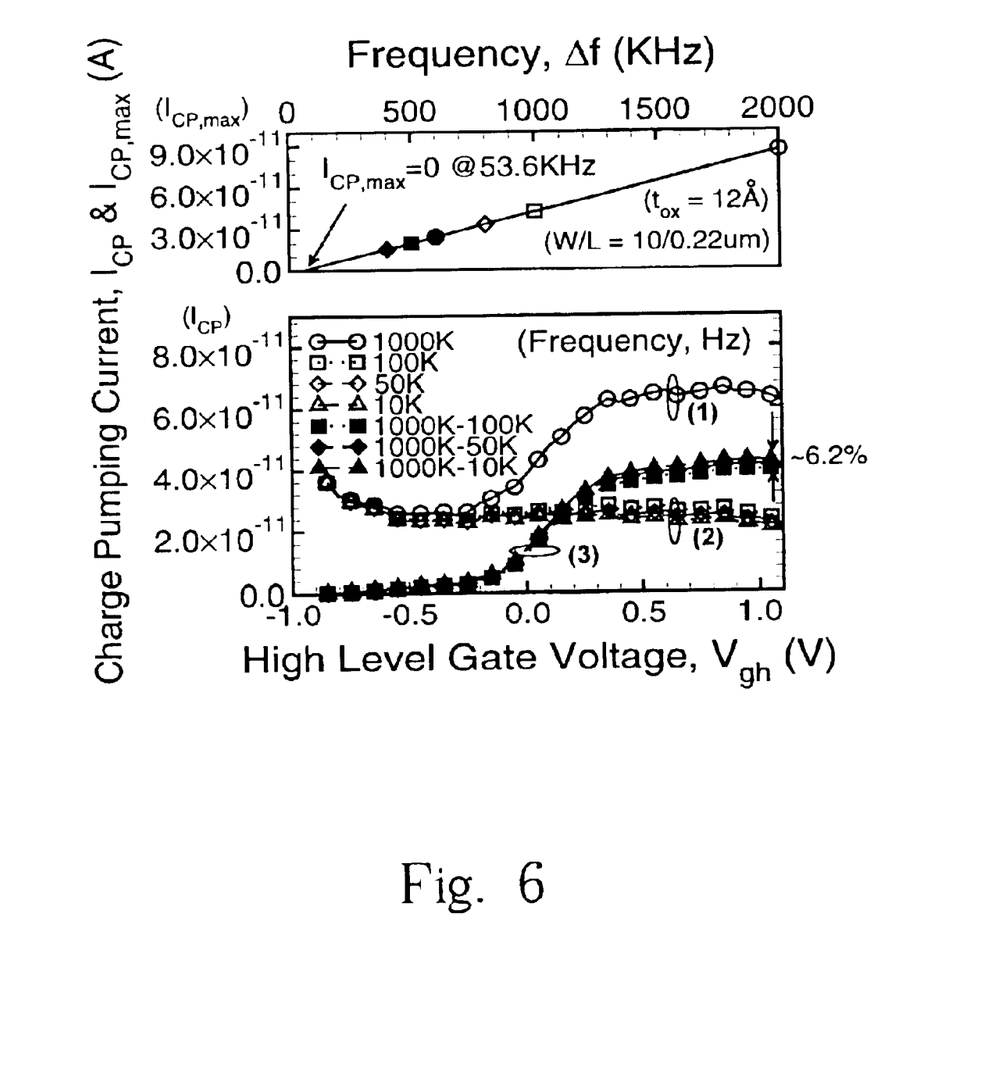
FIG. 6 shows High-low frequency CP method and Frequency dependent maximum CP currents.

Please refer to FIG. 1(c). FIG. 1(c) is a flowchart showing the steps of this invention. As shown in FIG. 1(c) with reference to FIG. 6 and FIG. 7, firstly, a low leakage CP measurement window is chosen. To choose a window for CP measurement, a bulk current ($I_B$) of about $10^{-12}$ to $10^-$ amperes is suggested (also see FIG. 4). Secondly, a fixed base level CP measurement is carried out. If a leakage component presents, the leakage component may be removed by either of the following steps:

(1) High-low frequency CP method: First, the $I_{CP}$ currents for various frequencies are measured as shown in FIG. 6. At a low gate pulse frequency, for example, $10^4$ Hz, the group-2 curve (curve (2)) is considered as the leakage current. Curve (1) is the measured $I_{CP}$ at a high gate pulse frequency, for example, 1 MHz. A correct $I_{CP}$ (group-3 curve) is obtained by subtracting curve (2) from curve (1).

Figure 7:
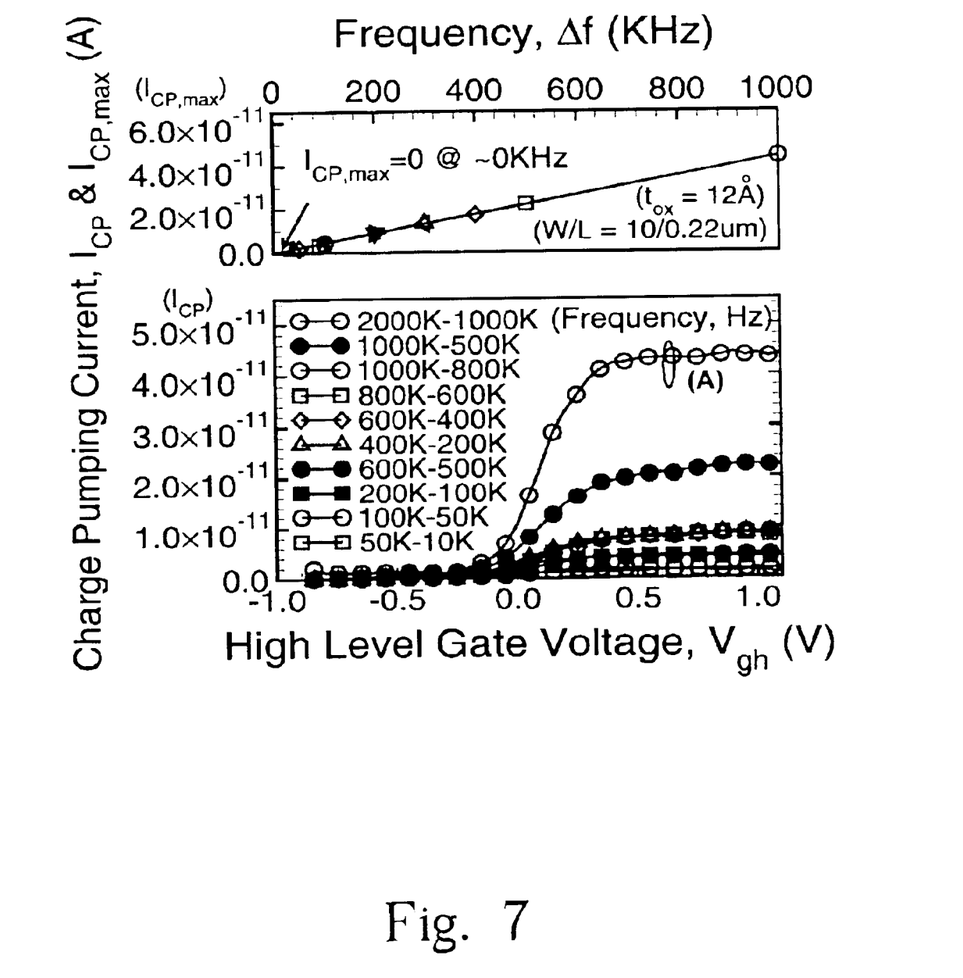
FIG. 7 shows Incremental frequency CP method and Frequency dependent maximum CP currents.

(2) Incremental frequency CP method: From the measured $I_{CP}$ for various frequencies, the difference of $I_{CP}$ between two successive frequencies is taken as shown in FIG. 7. For example, $I_{CP\ (1\ MHz)} - I_{CP\ (500\ kHz)}$ is regarded as the $I_{CP}$ at 500 kHz since $I_{CP}$ is directly proportional to f.

When comparing curve (3) of FIG. 6 and curve (A) of FIG. 7, for example, both of the two steps give a close result of $I_{CP}$ for a 1 MHz signal. Since the leakage component is close at two successive frequencies, the incremental frequency CP method is expected to give more accurate results. As expected, even for very-thin ($t_{ox} \leq 12$ Å) gate oxide devices, this new CP methodology is still valid.

Figure 8:
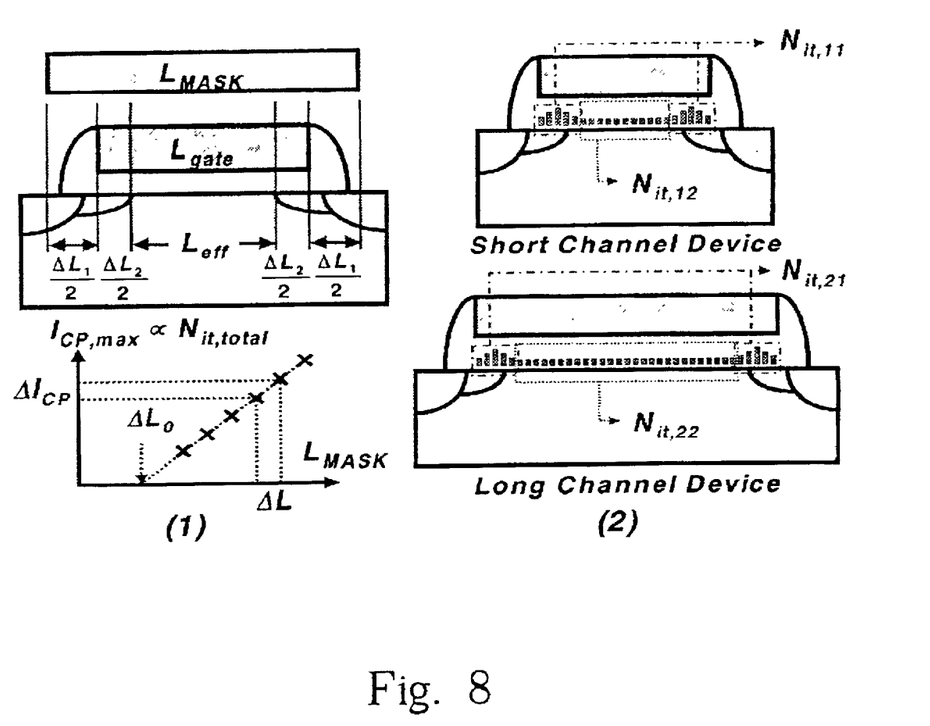
FIG. 8 illustrates $\Delta L_0$ extraction from CP data.

To determine the interface traps, $N_{it}$ can be calculated from the $I_{CP,\ MAX}$. The relating equations are given in Table 1. The definition and relating method are given in FIG. 8. FIG. 8 illustrates $\Delta L_0$ extraction from $I_{CP}$ data. FIG. 8 (1) shows parameter definition and extraction method. FIG. 8 (2) shows interface traps distribution in short and long channel length devices respectively.

Figure 9:
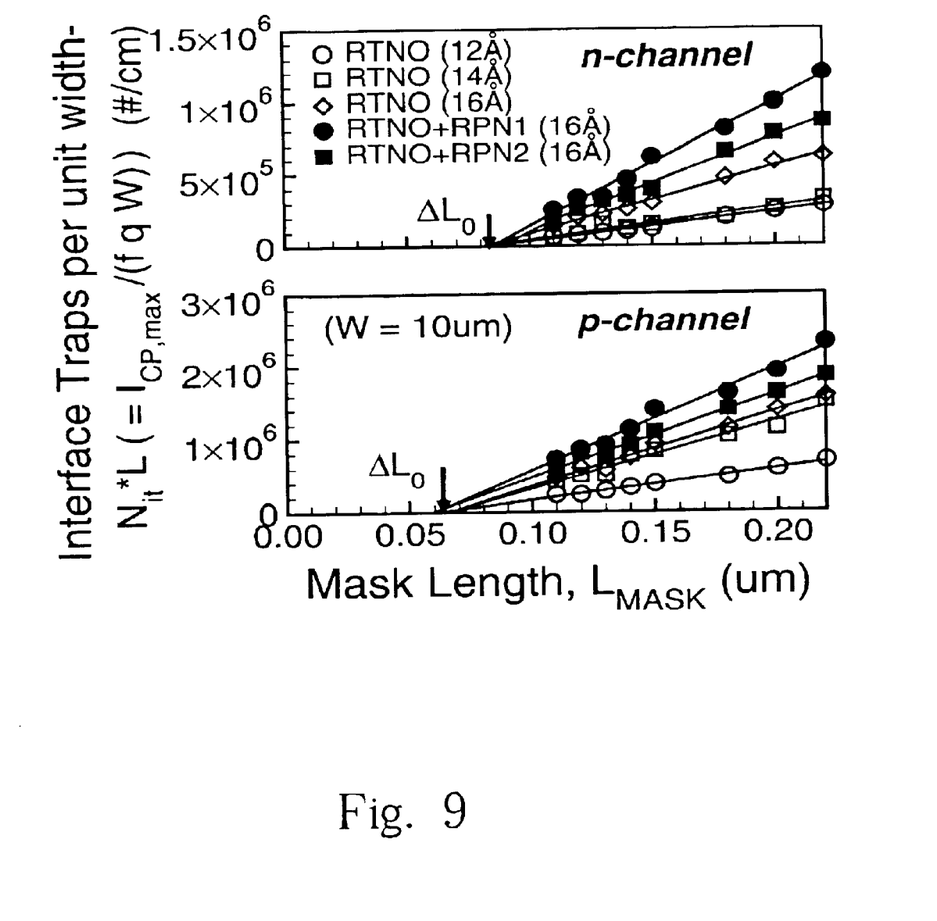
FIG. 9 shows calculated $N_{it}$ and $\Delta L_0$ from $I_{CP,MAX}$ in FIG. 7.
Figure 10:
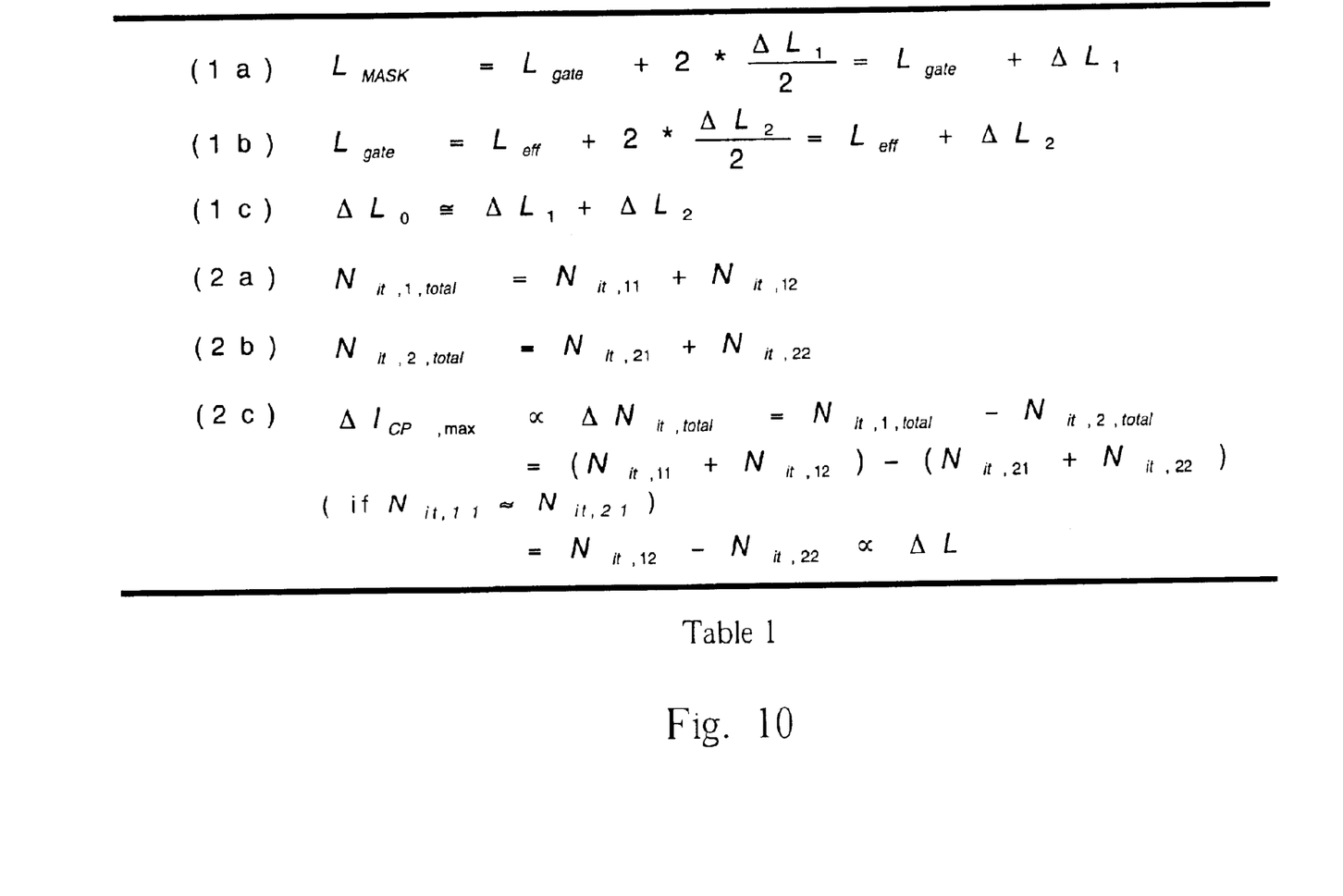
FIG. 10 illustrates Table 1 that shows the relating equations for determining the interface traps, $N_{it}$ that can be calculated from the $I_{CP, MAX}$.

FIG. 9 is a plot presenting calculated $N_{it}$ from $I_{CP,MAX}$ in FIG. 7. It shows the extraction of offset length $\Delta L_0$ ($\approx \Delta L_1$ ($\approx$0.04 um)+$\Delta L_2$). As illustrated in FIG. 9, the calculated $N_{it}$ per unit width for the measured 80 devices with n- and p-channel are presented. It should be noted that: (1) a thicker gate oxide exhibits larger $N_{it}$ as a result of a longer thermal treatment, (2) RPN treated gate oxide has larger $N_{it}$, and (3) the slopes of these curves give the $N_{it}$ values, which can be used as a monitor of the oxide quality.

In summary, this invention provides a new CP methodology that is demonstrated for ultra-short channel length and ultra-thin gate oxide in the range 12 Å to 16 Å. It allows fast and easy calculation of the $N_{it}$ generated during the process. This method is superior to the conventional CV method for $N_{it}$ characterization in that the latter needs a large area capacitor samples. On the other hand, both the Incremental frequency CP method and the High-low frequency CP method can be applied to evaluate the hot carrier reliability in terms of the interface traps for deep sub-micron scale devices. The proposed method not only can be used to calculate the $N_{it}$ values but also be useful as a monitor of the oxide quality in an ultra-thin gate oxide process.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for determining interface traps in a semiconductor/oxide interface of a MOS transistor comprising a bulk substrate, a source, a drain, a gate, and a silicon oxide layer beneath the gate, the method comprising:

grounding the bulk substrate, source, and drain;

applying a first gate pulse having a fixed low-level gate voltage ($V_{gl}$) and an increasing high-level gate voltage ($V_{gh}$) at a high gate pulse frequency on the gate so as to obtain a first charge-pumping current $I_{CP}$-$V_{gh}$ curve;

applying a second gate pulse having the same low-level gate voltage ($V_{gl}$) and the same increasing high-level gate voltage ($V_{gh}$) as the first gate pulse at a low gate pulse frequency on the gate so as to obtain a second $I_{CP}$-$V_{gh}$ curve; and subtracting the second $I_{CP}$-$V_{gh}$ curve from the first $I_{CP}$-$V_{gh}$ curve.

2. The method of claim 1 wherein the second $I_{CP}$-$V_{gh}$ curve is approximately equal to a leakage current component.

3. The method of claim 1 wherein the silicon oxide layer has a thickness of less than 30 angstroms.

4. The method of claim 1 wherein the silicon oxide layer has a thickness that is in a direct tunneling regime.

5. The method of claim 1 wherein the high gate pulse frequency is about 1 MHz and the low gate pulse frequency is about $10^4$ to $10^5$ Hz.

6. A method for testing a MOS transistor having an ultra-thin gate oxide layer, wherein the MOS transistor comprises a bulk substrate, a source, a drain, a gate, and an ultra-thin gate oxide layer disposed between the gate and the bulk substrate, the method comprising:

grounding the bulk substrate, source, and drain, wherein the source and the drain are electrically connected to each other;

applying a first gate pulse having a fixed low-level gate voltage ($V_{gl}$) and an increasing high-level gate voltage ($V_{gh}$) at a high gate pulse frequency on the gate so as to obtain a first $I_{CP}$-$V_{gh}$ curve;

applying a second gate pulse having the same low-level gate voltage ($V_{gl}$) and the same increasing high-level gate voltage ($V_{gh}$) as the first gate pulse at a low gate pulse frequency on the gate so as to obtain a second $I_{CP}$-$V_{gh}$ curve; and subtracting the second $I_{CP}$-$V_{gh}$ curve from the first $I_{CP}$-$V_{gh}$ curve so as to obtain a third $I_{CP}$-$V_{gh}$ curve that is regarded as a real charge-pumping current curve at the low gate pulse frequency.

7. The method of claim 6 wherein the ultra-thin gate oxide layer has a thickness of less than 20 angstroms.

8. The method of claim 6 wherein the ultra-thin gate oxide layer has a thickness that is in a direct tunneling regime.

* * * * *